United States Patent
Tanaka et al.

(10) Patent No.: US 6,766,417 B1
(45) Date of Patent: Jul. 20, 2004

(54) ENTERTAINMENT APPARATUS, INFORMATION PROCESSING UNIT AND PORTABLE STORAGE DEVICE

(75) Inventors: Makoto Tanaka, Tokyo (JP); Yoichiro Fukunaga, Tokyo (JP); Masaharu Yoshimori, Tokyo (JP)

(73) Assignee: Sony Computer Entertainment Inc. (JP)

( * ) Notice: Subject to any disclaimer, the term of this patent is extended or adjusted under 35 U.S.C. 154(b) by 0 days.

(21) Appl. No.: 09/685,525

(22) Filed: Oct. 10, 2000

(30) Foreign Application Priority Data

Oct. 12, 1999 (JP) .......................................... 11-289703
Sep. 28, 2000 (JP) ...................................... 2000-296184

(51) Int. Cl.[7] .......................................... G06F 12/00
(52) U.S. Cl. ........................ 711/115; 711/102; 711/103; 711/111; 711/112
(58) Field of Search .............................. 711/4, 105, 112, 711/114, 145, 156, 170, 171, 111, 172, 102, 103; 709/104; 710/56; 235/380, 487, 492

(56) References Cited

U.S. PATENT DOCUMENTS

| | | | | |
|---|---|---|---|---|
| 4,833,595 A | * | 5/1989 | Iijima ............................ | 235/380 |
| 5,034,914 A | * | 7/1991 | Osterlund ..................... | 710/52 |
| 5,200,600 A | | 4/1993 | Shinagawa .................... | 235/492 |
| 5,247,665 A | * | 9/1993 | Matsuda et al. ............. | 707/101 |
| 5,535,368 A | * | 7/1996 | Ho et al. ...................... | 711/170 |
| 5,724,544 A | * | 3/1998 | Nishi ........................... | 711/115 |
| 5,829,014 A | * | 10/1998 | Hayashi ....................... | 711/103 |
| 5,845,104 A | * | 12/1998 | Rao ............................. | 711/111 |
| 5,946,714 A | * | 8/1999 | Miyauchi ..................... | 711/205 |
| 6,120,379 A | | 9/2000 | Tanaka et al. | |
| 6,189,081 B1 | * | 2/2001 | Fujio ........................... | 709/104 |
| 6,216,201 B1 | * | 4/2001 | Ado et al. .................... | 711/112 |
| 6,272,589 B1 | * | 8/2001 | Aoki ............................. | 710/56 |
| 6,279,088 B1 | * | 8/2001 | Elliott et al. ................. | 365/220 |
| 6,453,379 B2 | * | 9/2002 | Nishiumi et al. ............... | 711/4 |

FOREIGN PATENT DOCUMENTS

| | | | |
|---|---|---|---|
| EP | 0 818731 A1 | 1/1998 | |
| EP | 818731 A1 * | 1/1998 | .......... G06F/12/06 |
| JP | 64-84473 A | 3/1989 | |
| JP | 02-62687 | 3/1990 | |
| JP | 3-229319 A | 10/1991 | |
| JP | 3-276383 A | 12/1991 | |
| JP | 9-198884 | 7/1997 | |
| JP | 09198884 A * | 7/1997 | .......... G11C/16/06 |
| JP | 10-27128 | 1/1998 | |
| JP | 11-144040 | 9/2000 | |

* cited by examiner

*Primary Examiner*—Matthew Kim
*Assistant Examiner*—Zhou H. Li
(74) *Attorney, Agent, or Firm*—Lerner, David, Littenberg, Krumholz & Mentlik, LLP

(57) ABSTRACT

An entertainment apparatus has a memory card, and an information processing unit to which the memory card is detachably connected. The memory card includes a flash ROM having identification information stored therein, and a ROM size table. The information processing unit is adapted to obtain page size information of the flash ROM from the identification information and the ROM size table and to control, in accordance with the obtained page size information, the reading and writing of data with respect to the flash ROM.

6 Claims, 4 Drawing Sheets

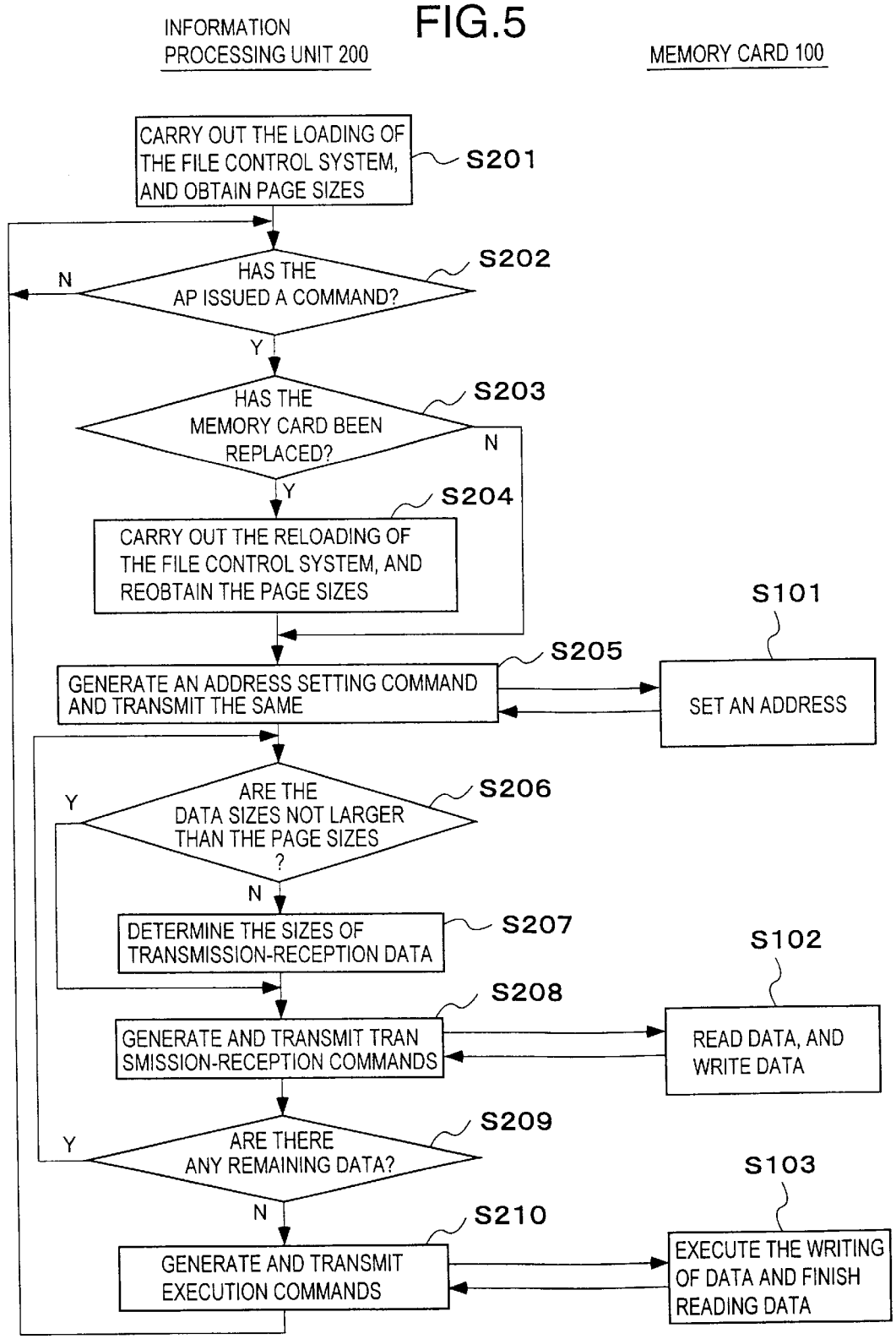

ENTERTAINMENT APPARATUS, INFORMATION PROCESSING UNIT AND PORTABLE STORAGE DEVICE

This application claims a priority based on Japanese Patent Application No. 11-289703 filed on Oct. 12, 1999 and Japanese Patent Application No. 2000-296184 filed on Sep. 28, 2000, the entire contents of which are incorporated herein by reference for all purposes.

BACKGROUND OF THE INVENTION

This invention relates to an entertainment apparatus, an information processing unit used therefor, and techniques concerning a portable storage device fixed detachably to the information processing unit, and more particularly to input and output control techniques for the information processing apparatus and the portable storage device.

In an entertainment apparatus comprising an information processing unit and a memory card capable of being attached to and detachable from the information processing unit, the memory card serves as an external storage for the information processing unit. The memory card is provided with a flash ROM, a control circuit, a clock generating circuit and a connecting terminal. When the memory card is connected to the information processing unit, the former communicates with the latter through the connecting terminal. The controlling of the communication and read write operations for the flash ROM are carried out by the control circuit. The data which the information processing unit desires to store in the memory card and the like are stored in the flash ROM by a unit of file.

The read write operations for the flash ROM are carried out by a page of predetermined size. The information processing unit cannot read and write over one page of data in one action out of and in the memory card.

SUMMARY OF THE INVENTION

The size of a page are determined usually in accordance with the capacity of the flash ROM as a whole. Therefore, when a read write control program for the information processing unit is developed for a flash ROM of a specific capacity, a flash ROM of some other capacity becomes unable to be utilized by the program, and the extendability becomes low. Namely, when the capacity of the flash ROM of the memory card is changed in the future, it becomes necessary to correct the control program. Even when the capacity of the flash ROM is increased with the control program used without being corrected, there is the possibility that the increased portion of the capacity of the flash ROM cannot be sufficiently utilized.

The present invention has been made in view of these circumstances, and provides an information processing unit the write read operations of which can be controlled even when the storage capacity of a portable storage device is changed, a portable storage device controlled by the information processing unit, and an entertainment apparatus.

According to an aspect of the present invention, the entertainment apparatus comprising a portable storage device, and an information processing unit to which the portable storage device is detachably connected, the portable storage device being provided with:
a storage member in which a size of a page out of and in which data can be read and written by one processing operation are pre-determined, and
a holding member for holding information capable of identifying the page size, the information processing unit being provided with:
a control member for controlling the reading and writing of the storage member on the basis of the information held in the holding member.

According to another aspect of the present invention, the information processing unit detachably connected to a portable storage device, the portable storage device being provided with:
a storage member in which a size of a page out of and in which data can be read and written by one processing operation are pre-determined, and
a holding member for holding information capable of identifying the page size, comprising;
a means for obtaining the information indicating page size to be identified by page size-identifiable information, and
a means for giving instructions to carry out read write operations to the storage member, wherein;
the instruction-giving means gives instructions to keep the page size of data to be read and written by one processing operation not higher than the page size.

According to still another aspect of the present invention, the portable storage device connected detachably to an information processing unit, comprising;
a storage member in which a size of a page out of and in which data can be read and written by one processing operation are pre-determined,
a holding member for holding information capable of identifying the page size, and
an instruction executing member for receiving instructions from the information processing unit and executing the instructions, wherein;
the instruction executing member outputs the page size-identifiable information with reference to the holding member when the instruction executing member receives a page size inquiring instructions, and
executes inputs and outputs information into and from the storage member when the instruction executing member receives input-output instructions for the storage member.

BRIEF DESCRIPTION OF THE DRAWINGS

Preferred embodiments of the present invention will be described on the basis of the following figures, wherein:

FIG. 5 is a flow chart of the procedure for command generation and analysis.

DESCRIPTION OF THE PREFERRED EMBODIMENTS

Modes of embodiments of the present invention will now be described with reference to the drawings.

In the following modes of embodiments, an information processing unit capable of playing a game, reproducing images and sounds, and communicating with some other device and the like, and a memory card which can be attached to and removed from the information processing unit will be described as examples.

When a game played by using the information processing unit is, for example, interrupted, the progress of the game made theretofore is written in the memory card and stored as data. The game can be resumed and continued from the condition at the point of the interruption of the game by using the data on the operational progress and the like.

Figure 1:
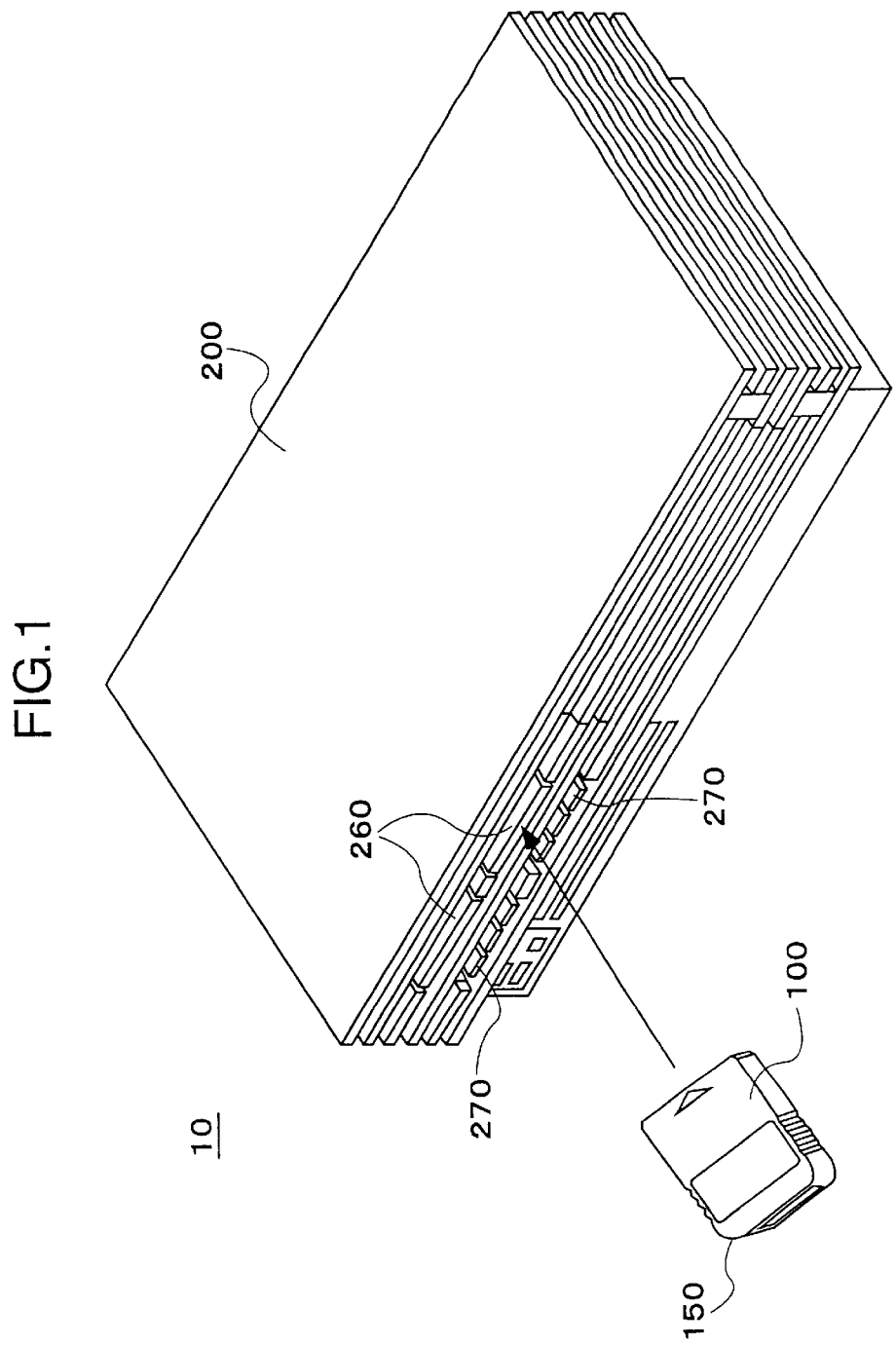
FIG. 1 is a sketch drawing of the information processing unit and memory card according to the present invention.

FIG. 1 is a sketch drawing showing a memory card 100 and an information processing unit 200 of this mode of embodiment. The memory card 100 is put into a memory card inserting hole 260 provided at the front of the information processing unit 200. Besides these members, a controller (not shown) and a TV monitor (not shown) are connected to the information processing unit 200, and the resultant product as a whole is formed as an entertainment apparatus 10. The controller is connected by inserting a plug joined to a cable (neither of which is shown) into a connector inserting hole 270.

Figure 2:
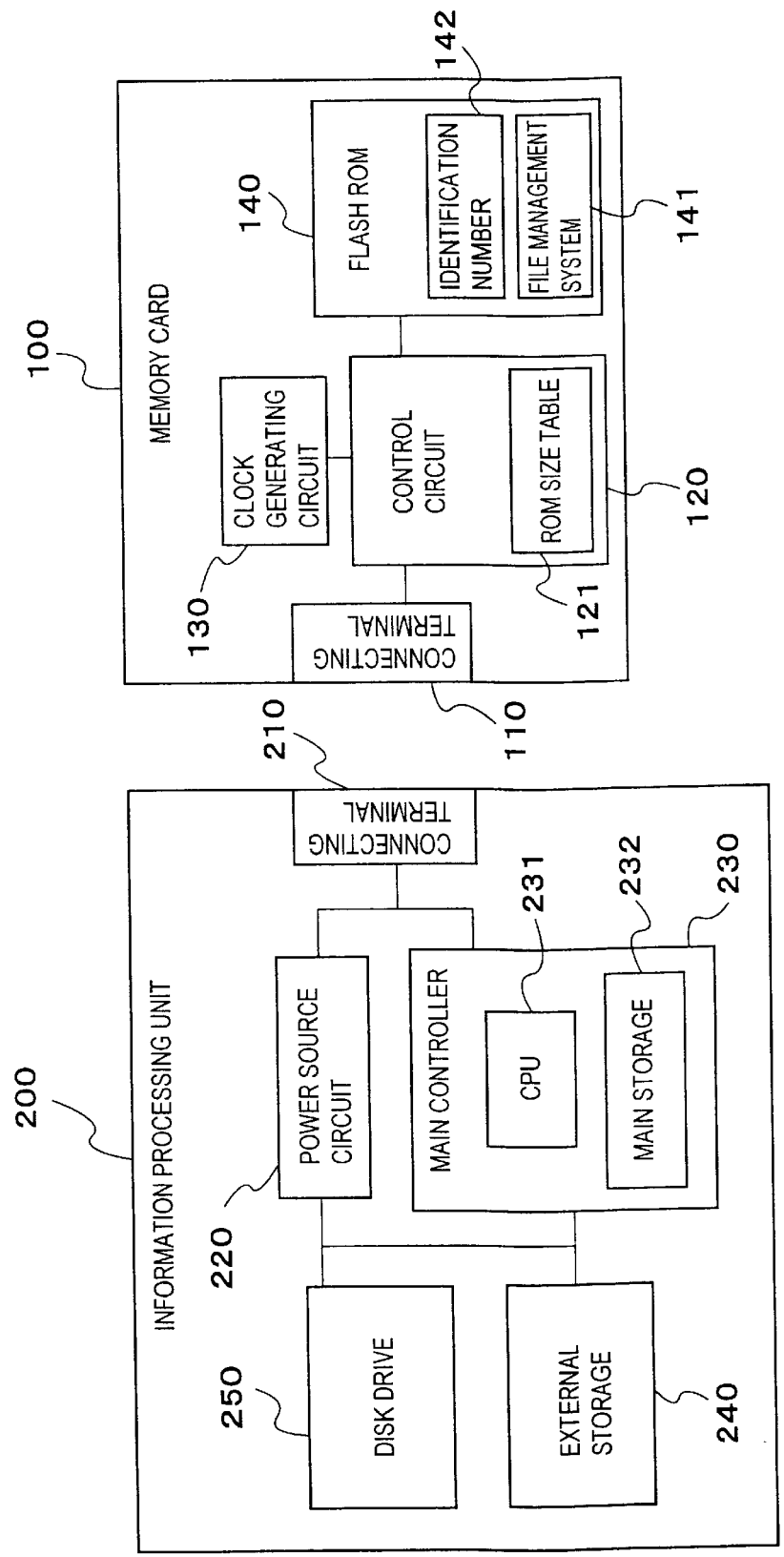
FIG. 2 is a construction diagram of hardware of the information processing unit and memory card according to the present invention.

FIG. 2 is a construction diagram of hardware of the memory card 100 and the information processing unit 200 of this embodiment.

The memory card 100 is provided with a connecting terminal 110, a control circuit 120, a clock generating circuit 130, a flash ROM 140, and a housing 150 (refer to FIG. 1) holding these parts therein.

When the memory card 100 is put into the memory card inserting hole 260 of the information processing unit 200, the connecting terminal 110 contacts the connecting terminal 210 of the information processing unit 200, and is electrically connected thereto. The control circuit 120 comprises, for example, a gate array (gate arrays), and retains a ROM size table 121 which will be described later. The clock generating circuit 130 generates a clock signal for operating the memory card. The flash ROM 140 stores the information sent from the information-processing unit 200 by a unit of each file. Because of its nature, the flash ROM 140 can be read from or written to by a unit of data, called a page, in one process. Accordingly, when the size of one file to be stored exceeds a unit of one page, the file is stored in plural pages. The size of the page is determined in accordance with the capacity of the flash ROM 140. In a predetermined region of the flash ROM 140, a file management system 141 and an identification number 142 of the ROM are stored. The file management system 141 stores information concerning the condition of use of the flash ROM 140. For example, the file management system 141 stores in a corresponding manner an address of the flash ROM 140 and a name of file stored in the address. The identification number 142 is a number peculiar to the flash ROM 140 mounted on each memory card. With reference to this identification number 142 and the information in the ROM size table 121, the capacity of the flash ROM 140 and a page size can be determined.

The information processing unit 200 is provided at least with a connecting terminal 210, a power source circuit 220, a main controller 230, an external storage device 240 and a disk drive 250. The main controller 230 is provided at least with a CPU 231 and a main memory 232. The power source circuit 220 supplies electric power to the information processing unit 200 and memory card 100.

Figure 3:
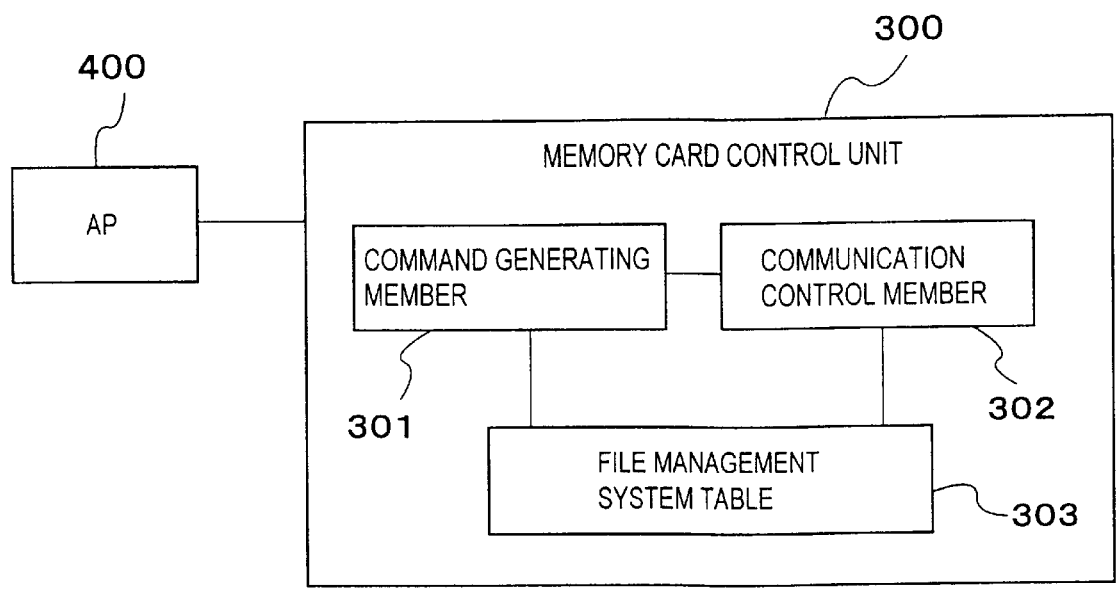
FIG. 3 is a functional block diagram of a main controller in the information processing unit according to the present invention.

A functional block of the main controller 230 will now be shown in FIG. 3.

The main controller 230 is provided at least with a memory card management unit 300 for managing the memory card, and an application execution function (which will hereinafter be referred to as "AP") 400 attained by executing an application program. The memory card management unit 300 receives a demand from the AP 400, and manages an input into and an output from the memory card 100. The AP 400 sends to the memory card management unit 300 commands for reading and writing data by a unit of file.

The memory card management unit 300 is further provided with a command generating member 301, a communication control member 302 and a file management system table 303.

The file management system table 303 is formed by loading the file management system 141 of the memory card 100 thereinto. The loading of the file management system 141 is done when the information processing unit 100 accesses the memory card 100 for the first time after the memory card 100 is inserted into the information processing unit 200. While the memory card 100 is inserted in the information-processing unit 200, the already-made file management system table 303 is utilized. When the memory card 100 is once removed and then re-inserted, the file management system table 303 is re-loaded. The file management system 141 contains information peculiar to each memory card. Therefore, accessing the flash ROM on the basis of a file management system for some other memory card may destroy the data in the flash ROM 140. The withdrawing and inserting of the memory card, for instance, can be detected by providing a switch in the vicinity of the memory card inserting hole 260.

The command generating member 301 issues a command for obtaining information of the page size and a command for accessing the flash ROM 140. The command for accessing the flash ROM 140 is generated after receiving a command for reading or writing information by a unit of file from the AP 400.

The command for obtaining the page size is issued simultaneously with the loading of the file management system 141. The obtained information of the page size is held in the command generating member 301.

The command for accessing the flash ROM 140 includes three subcommands, namely, a subcommand for setting an address at which data are read from or written to the flash ROM 140, a subcommand for transmitting and receiving data to be read from or written to the flash ROM 140, and a subcommand for executing the writing of data to the flash ROM 140, or finishing the reading of data.

In order to generate the address setting subcommand, the command generating member 301 obtains an address with reference to the file management system table 303. In order to generate the transmission and reception subcommand, the command generating member 301 generates the subcommand by a unit of file when the size of the file to be read or written do not exceed the page size. When the size of the file to be read and written exceed the page size, the command generating member 301 divides the file so that the size of the data to be read or written by one process does not become larger than the page size. The command generating member 301 then generates a transmission and reception subcommand. Namely, when the size of a file to be read or written exceeds the page size, file reading and writing instructions are given in a plurally divided manner. This is based on the nature of the flash ROM 140 which can be read and written data only by a page as a unit of data.

The communication control member 302 controls the communication with the memory card 100.

Figure 4:
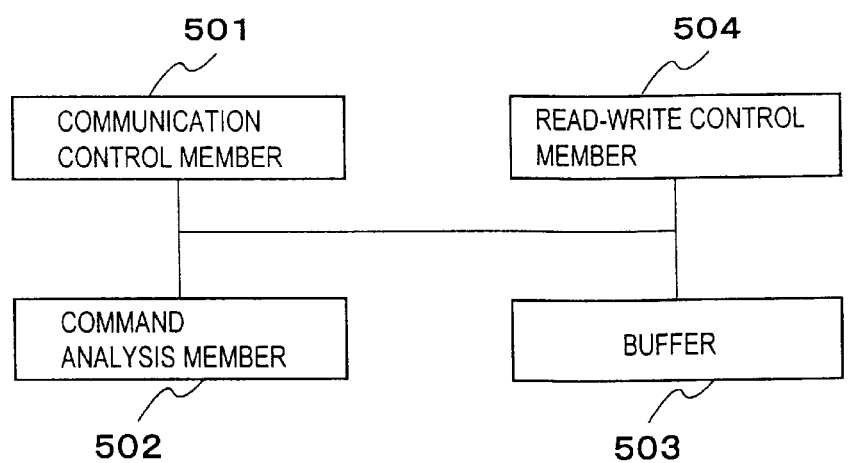
FIG. 4 is a functional block diagram of a control circuit in the information processing unit according to the present invention.

A functional block diagram of the control circuit 120 will now be shown in FIG. 4.

The control circuit 120 is provided at least with a communication control member 501, a command analysis member 502, a buffer 503 and a read write control member 504. The communication control member 501 receives commands and the like from the information processing unit 200, and returns the page size of the flash ROM 140, the results of a process, and the data read out and so on. The command analysis member 502 analyzes the commands received, and outputs an address setting instruction and a read or write instruction, which are to be sent to the flash ROM 140, to the read write control member 504. The command analysis member 502 further obtains the identification number 142 through the read write control member 504. The command analysis member 502 identifies the page size of the flash ROM 140 on the basis of the ROM size table 121 and outputs the page size of the flash ROM 140. The buffer 503 temporarily stores the contents of the data to be read or written. The read write control member 504 controls the reading and writing of data out of and in the flash ROM 140.

In this embodiment, the control circuit 120 is formed of gate arrays, so that the function of the control circuits is all attained by hardware logic. This function can also be attained by software by providing the memory circuit with a microcomputer.

The operation of the memory card 100 having the above-described construction and information-processing unit 200 will now be described.

FIG. 5 shows the procedure for generating and analyzing of commands. First, as preprocessing for generating commands, the command generating member 301 loads the file management system 141 and obtains the page size from the memory card 100 with which the communication control member 302 communicates (S201). In this condition, the memory card management unit 300 becomes able to receive commands from the AP 400. The command generating member 301 then becomes on standby for receiving a command from the AP 400 (S202).

When the AP 400 issues a command for reading or writing data with respect to the memory card 100, the command generating member 301 receives the command. The command generating member 301 ascertains whether the memory card 100 has been replaced or not. When the memory card is replaced, the communication control member 302 re-loads the file management system and re-obtains the page size (S203 and S204).

The command generating member 301 obtains an address to be accessed of the flash ROM 140 with reference to the file management system table 303. The command generating member 301 generates an address setting subcommand. The generated address setting subcommand is sent to the memory card 100 through the communication control member 302 (S205). In the memory card 100, the communication control member 501 receives the command. The command analysis member 502 sets the address of the flash ROM 140 (S101).

When the size of the data to be read or written is larger than the page size, the command generating member 301 determines the size of the data processed by one access, in such a manner that the size of the data become not larger than the page size (S207).

The command generating member 301 generates a transmission and reception subcommand to be transmitted to the memory card 100, and transmits a transmission and reception command thereto through the communication control member 302 (S208). The memory card 100 receives the transmission and reception subcommand. The command analysis member 502 executes the accumulation of data on the buffer 503 or the reading of data out of the flash ROM 140 on the basis of the content of the command (S102). When data to be read or written still remain, the steps S206–S208 are repeated (S209).

When the data to be read or written run out, the command generating member 301 generates an execution subcommand, and transmits (S210) the execution command.

In the memory card, the following processing operations are carried out, respectively, in accordance with the execution command.

In order to write data, the data stored in the buffer 503 are written into the flash ROM 140 in accordance with the execution command. As a result, the content of the flash ROM 140 is updated. In order to read data, the reading out data from the flash ROM 140 is finished. Namely, a series of processing operations including reading and writing operations are completed in accordance with the execution command.

According to this embodiment described above, it is possible to access the flash ROM reliably even when the page size of the flash ROM mounted on the memory card is different.

According to the present invention, an information-processing unit is provided, capable of controlling reading and writing operations even when the capacity of a portable storage device is changed a portable storage device controlled by the information processing unit, and an entertainment apparatus.

What is claimed is:

1. An entertainment apparatus, comprising:

a portable storage device; and an information processing unit to which said portable storage device is detachably connectable;

said portable storage device including a storage member having a predetermined page size determined by a physical property of said storage member, the page size limiting the amount of data which can be read from said storage member by one processing operation and written to said storage member by one processing operation irrespective of a file size of the data;

a holding member for holding page size information for use in identifying the predetermined page size; and a housing holding said storage member and said holding member and not holding said information processing unit;

said information processing unit including a control member operable to identify the predetermined page size from the page size information held in said holding member and to control the reading from and writing to said storage member in units of the predetermined page size, so that when the predetermined page size is a first size, said control member is operable to control reading from and writing to said storage member in units of the first size, and when the predetermined page size is a second size different from the first size, said control member is operable to control reading from and writing to said storage member in units of the second size.

2. An information processing unit detachably connectable to a portable storage device including a storage member having a predetermined page size limiting the amount of data which can be read from the storage member in one processing operation and written to the storage member in one processing operation irrespective of a file size of the data, the information processing unit comprising:

means for obtaining from the portable storage device page size information for use in identifying the predetermined page size; and means for generating instructions to carry out read operations from and write operations to the storage member in units of the predetermined page size identified from the page size information, so that when the predetermined page size is a first size, the instructions are generated to carry out read operations from and write operations to the storage member in units of the first size, and when the predetermined page size is a second size different from the first size, the instructions are generated to carry out read operations from and write operations to the storage member in units of the second size;

wherein the instructions include instructions to read an entire file from the storage member by one processing operation when the entire file has a size which is not larger than the predetermined page size, instructions to write an entire file to the storage member by one processing operation when the entire file has a size which is not larger than the predetermined page size, instructions to divide the entire file into a group of subfiles when the size of the entire file exceeds the predetermined page size, each subfile not exceeding the predetermined page size, instructions to read a subfile of the group of subfiles from the storage member by one processing operation and instructions to write a subfile of the group of subfiles to the storage member by one processing operation.

3. A portable storage device detachably connectable to an information processing unit, the portable storage device comprising:

a storage member having a predetermined page size determined by a physical property of said storage member, the predetermined page size limiting the amount of data which can be read from said storage member by one processing operation and written to said storage member by one processing operation irrespective of a file size of the data;

a holding member for holding page size information for use in identifying the predetermined page size;

an instruction executing member for receiving instructions from the information processing unit and executing the instructions, wherein said instruction executing member outputs the page size information to the information processing unit when said instruction executing member receives a page size inquiring instruction, and executes writes of information into said storage member and reads of information from said storage member in units of the predetermined page size when said instruction executing member receives input-output instructions for said storage member from the information processing unit, such that said instruction executing member carries out writes of information and reads of information in units of a first size when the predetermined page size is the first size and in units of a second size different from the first size when the predetermined page size is the second size; and a housing holding said storage member, said holding member and said instruction executing member and not holding the information processing unit.

4. The portable storage device according to claim 3, wherein:

the page size information comprises information for identifying said storage member, and associated page size information; and said instruction executing member determines the predetermined page size on the basis of the identifying information and the associated page size information.

5. A portable storage device detachably connectable to an information processing unit, the portable storage device comprising:

a storage member for storing identification information of said storage member, the identification information allowing the reading of data out of and the writing of data into said storage member in units of a page size of said storage member;

a control member having page size information in which the stored identification information is associated with the page size of said storage member, the page size limiting the amount of data that can be read from the storage member by one processing operation and written to the storage member by one processing operation irrespective of a file size of the data, said control member controlling the reading of data out of and the writing of data into said storage member according to signals received from the information processing unit for reading data out of and writing data into said storage member in units of the page size, such that when the page size is a first size, said control member controls the reading of data out of and the writing of data into said storage member in units of the first size, and when the page size is a second size different from the first size, said control member controls the reading of data out of and the writing of data into said storage member in units of the second size; and a housing holding said storage member and said control member and not holding the information processing unit.

6. A memory card detachably connectable to an information processing unit, the memory card comprising:

a flash memory for storing an identification number of said flash memory from which a page size is determined which limits an amount of data that can be read from said flash memory in one operation and an amount of data that can be written to said flash memory in one operation irrespective of a file size of the data;

a control circuit having a size table which identifies a capacity of said flash memory and the page size of said flash memory according to the stored identification number, for use by the information processing unit to determine the page size, said control circuit operable to control reading from and writing to said flash memory according to signals received from the information processing unit for reading data out of and writing data into said flash memory in units of the page size, such that when the page size is a first size, said control circuit controls the reading of data out of and the writing of data into said flash memory in units of the first size, and when the page size is a second size different from the first size, said control circuit controls the reading of data out of and the writing of data into said flash memory in units of the second size; and a housing holding said flash memory and said control circuit and not holding the information processing unit.

* * * * *

UNITED STATES PATENT AND TRADEMARK OFFICE
CERTIFICATE OF CORRECTION

PATENT NO. : 6,766,417 B1
DATED : July 20, 2004
INVENTOR(S) : Makoto Tanaka, Yoichiro Fukunaga and Masaharu Yoshimori It is certified that error appears in the above-identified patent and that said Letters Patent is hereby corrected as shown below:

Column 1,
Lines 39 and 65, "are" should read -- is --.
Line 59, "comprising" should read -- comprises --.

Column 2,
Line 6, after "unit" insert -- is --.
Lines 11 and 30, "are" should read -- is --.
Line 27, "comprising" should read -- comprises --

Column 4,
Line 55, "do" should read -- does --.
Line 56, "exceed" should read -- exceeds --.

Column 5,
Line 63, "become" should read -- becomes --.

Column 6,
Line 22, "are" should read -- is --.
Line 31, after "changed" insert -- , --.

Signed and Sealed this

Nineteenth Day of October, 2004

JON W. DUDAS
*Director of the United States Patent and Trademark Office*